US006737220B2

(12) United States Patent
Mori

(10) Patent No.: US 6,737,220 B2
(45) **Date of Patent: *May 18, 2004**

(54) PRINTING METHOD AND PRINTING PRESS

(75) Inventor: Takahiro Mori, Hino (JP)

(73) Assignee: Konica Corporation, Tokyo (JP)

(*) Notice: Subject to any disclaimer, the term of this patent is extended or adjusted under 35 U.S.C. 154(b) by 123 days.

This patent is subject to a terminal disclaimer.

(21) Appl. No.: 10/056,152

(22) Filed: Jan. 24, 2002

(65) Prior Publication Data

US 2002/0172891 A1 Nov. 21, 2002

(30) Foreign Application Priority Data

Jan. 30, 2001 (JP) ....................................... 2001-021569

(51) Int. Cl.$^{7}$ .................................................. G03F 7/30

(52) U.S. Cl. ....................... 430/302; 430/309; 430/401; 430/494; 430/944; 430/945

(58) Field of Search ........................... 430/270.1, 271.1, 430/273.1, 302, 303, 309, 348, 401, 494, 944, 945, 964; 101/453, 463.1, 465, 466, 467

(56) References Cited

U.S. PATENT DOCUMENTS 6,399,276 B1 * 6/2002 Van Damme et al. ... 430/273.1
6,482,571 B1 * 11/2002 Teng .......................... 430/302
6,596,462 B2 * 7/2003 Mori ....................... 430/272.1
6,596,464 B2 * 7/2003 Van Damme et al. ...... 430/302
2002/0072013 A1 * 6/2002 Vander Aa .................. 430/302

* cited by examiner

*Primary Examiner*—Mark F. Huff
*Assistant Examiner*—Barbara Gilliam
(74) *Attorney, Agent, or Firm*—Frishauf, Holtz, Goodman & Chick, P.C.

(57) ABSTRACT

A method of printing an image with a printing plate prepared from a printing plate precursor, which comprises a support having thereon an image forming layer A containing a water-soluble material, the method comprising the steps of: (a) imagewise exposing the layer A of the printing plate precursor so as to form an unexposed portion and an exposed portion; (b) supplying an emulsion ink containing an oil-based ink and water onto the layer A so that the unexposed portion is removed from the layer A so as to form a non image portion and the exposed portion remains in the layer A so as to form an image portion to give the printing plate, wherein the image portion is lyophilic and the non image portion is hydrophilic; and (c) printing the image on the printing plate to an image receiving material while further supplying the emulsion ink.

14 Claims, 4 Drawing Sheets

PRINTING METHOD AND PRINTING PRESS

FIELD OF THE INVENTION

The present invention relates to a printing method and a printing press, and particularly to a printing method of developing an on-press type printing plate precursor mounted on a printing press with emulsion ink and carrying out printing, and a printing press employing the method.

BACKGROUND OF THE INVENTION

Recently, a printing press equipped with an image forming means represented by an infrared laser irradiation device, a so-called DI printing press, has been focused on as a system for prompt delivery of prints and reduction of printing cost. As the DI printing press, there are a printing press employing dampening water and a waterless type printing press employing no dampening water, as in an ordinary printing press.

The waterless type DI printing press has no device for supplying dampening water, and even if the press is installed with an image forming system, it can be structured very compactly. For example, there are provided printing presses such as Quickmaster-46-DI produced by Heidelberg Co., Ltd. and 3404DI produced by Ryobi Co., Ltd., which can be installed in a reduced space, and can be applied in an office environment.

The waterless type printing press does not require the delicate control of dampening water supply amount nor any special operation skill, which is one of the elements suitable for an office environment.

FIG. 1 shows the fundamental structure of Quickmaster-46-DI produced by Heidelberg Co., Ltd. This printing press has four sets each including a blanket cylinder 2, a plate cylinder 1, an ink supply system 4, and an infrared laser exposure system 5 in a satellite state around an impression cylinder 3 having a diameter 4 times greater than that of the plate cylinder 1.

FIG. 2 shows a sectional view of a plate cylinder 1, which illustrates in detail the interior of the plate cylinder 1. That is, the plate cylinder 1 has, within the cylinder, a supply spool 1*b* and an uptake spool 1*c*, and has a construction in which a printing plate precursor 9 is stored in the roll form on supply spool 1*b* within the cylinder, unrolled, withdrawn through an opening 1*a*, brought onto the outer surface of the cylinder and wrapped around the cylinder, reintroduced through opening 1*a* into the cylinder, and received by uptake spool 1*c* within the cylinder.

Fixation of a printing plate precursor on the plate cylinder can be carried out, for example, by locking either one of the supply spool or the uptake spool not to rotate, applying a rotational torque in the rotational direction to the other spool to apply a certain tension to the plate precursor, and then locking it. Further, the interior of the plate cylinder as disclosed in Japanese Patent O.P.I. Publication No. 7-101044 is also usable.

Further, as in the printing press disclosed in Japanese Patent O.P.I. Publication Nos. 11-28802, which has a plate cylinder composed of two cylinders, one being an outer hollow cylinder having orifices and the other an inner cylinder, fixation of a plate precursor on the plate cylinder can be carried out by mounting the plate precursor on the outer, hollow cylinder, and then sucking air through the orifices from beneath the plate mounted on the outer cylinder.

The printing method comprises the steps of withdrawing a printing plate precursor 9 stored in the roll form (resin material) within the plate cylinder 1, bringing it onto the outer surface of the plate cylinder 1 to wrap the cylinder, imagewise exposing the precursor employing an infrared laser exposure system 5 to ablate the exposed portions of the precursor, cleaning the surface of the exposed precursor through a cleaning system 6 to remove the ablation residue to form an image, and subsequently supply ink onto the surface of the resulting precursor through an ink supply system 4, whereby printing is carried out. A water supply is not needed, since a waterless printing plate precursor is used, and the printing press has no water supply system, since a waterless printing plate precursor is exclusively used.

Printing paper is fed to an impression cylinder 3 from a printing paper feeding section 7. Four different color inks transferred from four plate cylinders 1 to four blanket cylinders 2 are sequentially transferred to the printing paper to obtain four-color prints, which is subsequently supplied to a delivery section 8.

As described above, a waterless printing plate precursor makes it possible to use a compact printing press relative to the size of the paper sheet to be printed. The waterless printing plate precursor, which is presently supplied for a DI printing press, is an ablation type waterless printing plate precursor, and requires cleaning of the printing plate precursor surface after laser exposure as described above to form an image. This cleaning step increases the set-up time for printing, which is one factor of the cost increase. Further, use of a cleaning solution and non-woven fabric for cleaning also adds to the cost increase.

In contrast, as a printing plate precursor used in the DI printing press employing dampening water, a so-called "processless CTP material", there is a printing plate precursor disclosed in, for example, U.S. Pat. Nos. 2,938,397 and 2,938,398, which comprises a hydrophilic support having thereon an imaging layer containing heat-fusible hydrophobic thermoplastic polymer particles dispersed in a hydrophilic binder. In this precursor, a so-called "on press development" is required, which comprises the steps of mounting the precursor on a plate cylinder of a printing press, exposing the precursor employing a laser, and supplying dampening water and ink onto the surface of the exposed precursor while rotating the plate cylinder to remove unexposed portions of the imaging layer. As compared with the waterless printing plate precursor as described above, this printing plate precursor does not require an exclusive plate surface cleaning system nor processing materials thereof, reducing the running cost. However, the printing plate precursor has the problem in that the set-up time for printing resulting from on press development increases.

Recently, there has been developed a printing plate precursor which starts printing without cleaning the printing plate surface nor carrying out on press development in the same manner as in a conventional PS plate, and exhibits the same rise in printing as the PS plate, for example, the printing plate precursor as disclosed in Japanese Patent Application No. 11-358969. Application of such a printing plate precursor to a DI printing press requires no exclusive printing plate surface cleaning system and makes it possible to markedly reduce a set-up time for printing, resulting in the possibility of reducing the running cost.

However, at present, even if such a printing plate precursor is applied, the DI printing press is considered to need the same continuous water supply system as that of a printing press used in the PS plate, and has a construction in which an image forming system is installed in a general unit type printing press (carrying out one color printing per one unit) (for example, Speedmaster 74-DI series produced by Heiderberg Co. Ltd.), which requires a large establishment area relative to the printing sheet size.

Further, since the printing plate precursor employs dampening water in printing, a printing skill is required.

There is disclosed a printing method in U.S. Pat. No. 6,095,048, which comprises the step of (b) imagewise exposing an ablation type printing plate precursor (a) employing water which has an outermost layer containing polyvinyl alcohol capable of being removed by a non-aqueous single fluid ink, and (c) removing the outermost layer by carrying out printing employing the non-aqueous single fluid ink. Use of polyvinyl alcohol in a protective layer results in various problems that background contaminations are likely to be produced at the initial printing stage and staining is likely to be produced at portions of the printing plate precursor where fingers touched, even in the conventional printing methods. In this case, a counter measure such as use of dampening water containing alcohol is required, but an optimum combination of the structure or materials used of the printing plate precursor with the single fluid ink has not still been developed.

SUMMARY OF THE INVENTION

An object of the present invention is to provide a printing method employing a printing plate precursor employing dampening water which provides reduced running cost, and does not require a high degree of skill, and to provide a printing press for a printing plate precursor employing dampening water which is capable of being small-sized, reduces running cost, and does not require a high degree of skill.

The above object has been attained by one of the following constitutions:

1. A method of printing an image with a printing plate prepared from a printing plate precursor, which comprises a support having thereon an image forming layer A containing a water-soluble material, the method comprising the steps of:
   (a) imagewise exposing the layer A of the printing plate precursor so as to form an unexposed portion and an exposed portion;
   (b) supplying an emulsion ink containing an oil-based ink and water onto the layer A so that the unexposed portion is removed from the layer A so as to form a non image portion and the exposed portion remains in the layer A so as to form an image portion to give the printing plate, wherein the image portion is lyophilic and the non image portion is hydrophilic; and
   (c) printing the image on the printing plate to an image receiving material while further supplying the emulsion ink.
2. The method of item 1, wherein the water-soluble material in the layer A is a saccharide.
3. The method of item 1, wherein the printing plate precursor further comprises a hydrophilic layer B between the support and the layer A, wherein the layer A further comprises heat-fusible particles or thermoplastic particles.
4. The method of item 3, wherein the water-soluble material in the layer A is an oligosaccharide.
5. The method of item 3, wherein the hydrophilic layer B is a porous layer.
6. The method of item 3, wherein the hydrophilic layer B further comprises a light-heat conversion material.
7. The method of item 1, wherein the printing plate precursor further comprises a layer C which is capable of being ablated and a hydrophilic layer B on the support in that order, the layer A being located on the layer B.
8. The method of item 7, wherein the water-soluble material in the layer A is a polysaccharide.
9. The method of item 1, wherein the printing is carried out without supplying water on the surface of the printing plate during printing.
10. The method of item 1, wherein water is supplied on the surface of the printing plate precursor prior to supplying the emulsion ink on the surface of the printing plate precursor.
11. The method of item 10, wherein water is supplied with a water spraying device on the surface of the printing plate precursor.
12. The method of item 11, wherein an amount of water W ($g/m^2$) supplied on the surface of the printing plate precursor and a coating coverage Q ($g/m^2$) of the layer A satisfy the following formula, $$0.1 \leq W/Q \leq 50.$$

13. The method of item 1, wherein the step (a) is carried out after the printing plate precursor is mounted on a plate cylinder of a printing press.
14. The method of item 1, wherein an infrared laser is employed for imagewise exposing the printing plate precursor.

Examples of printing presses for the above-mentioned methods are as follows.

(i) a printing press comprising an exposure system employing an infrared laser capable of forming an image on a printing plate precursor mounted on the plate cylinder and comprising no water supply system for continuously supplying water onto the surface of the printing plate precursor during printing.

(ii) a printing press comprising an exposure system employing an infrared laser capable of forming an image on a printing plate precursor mounted on the plate cylinder and a water supply system for supplying water onto the surface of the printing plate precursor so that water does not directly contact ink.

(iii) the printing press of item (ii), comprising a water supply system which brings a water supply roller into contact with the surface of the printing plate precursor while rotating the plate cylinder to supply water onto the printing plate precursor surface, and then separates the water supply roller from the printing plate precursor surface before carrying out printing by bringing an ink supply roller into contact with the surface of the printing plate precursor.

(iv) the printing press of item (ii), wherein the water supply system is a water spraying device which is capable of spraying water onto the surface of the printing plate precursor.

DETAILED DESCRIPTION OF THE INVENTION

Figure 1:
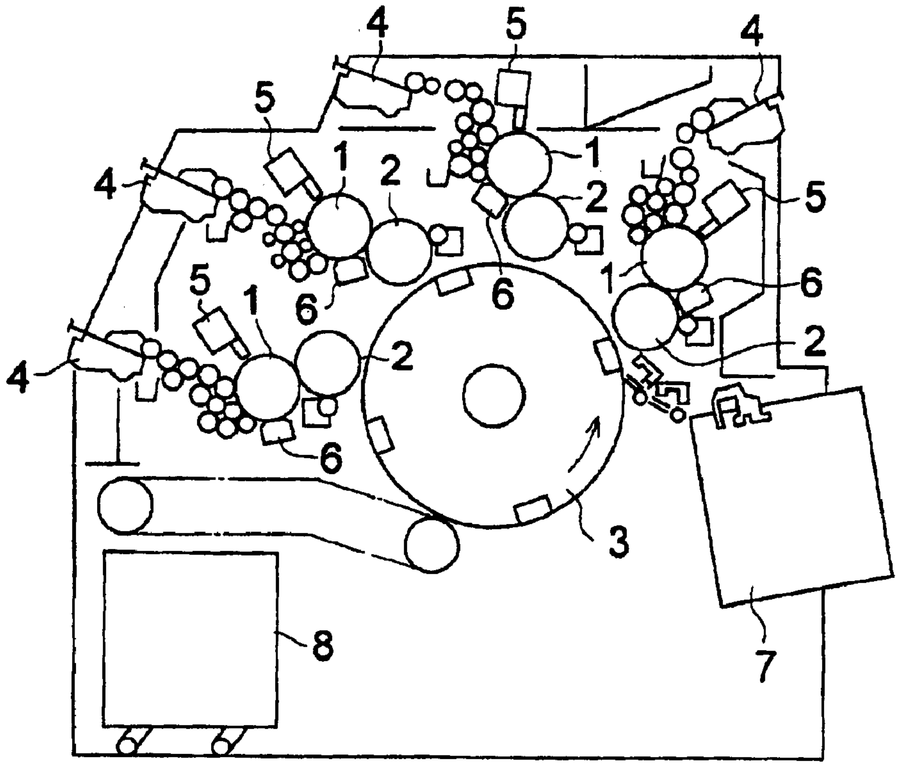
FIG. 1 shows a sectional view of a plate cylinder of a conventional printing press in which a printing plate precursor in the roll form is stored within the plate cylinder.
Figure 2:
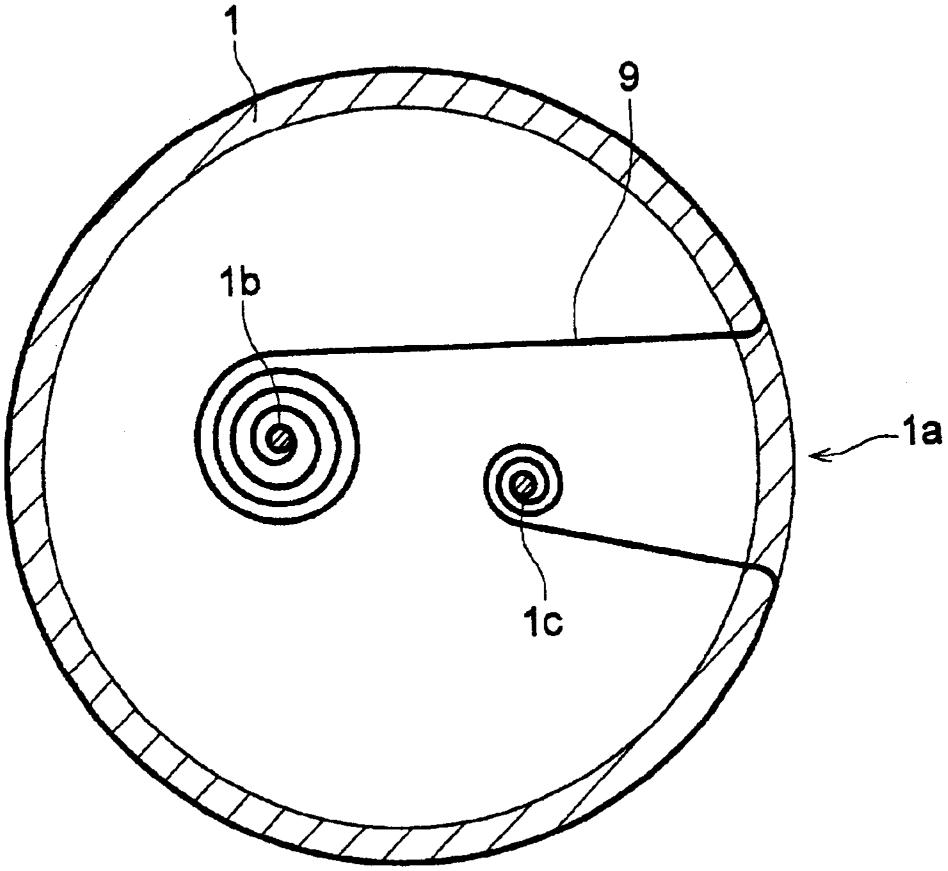
FIG. 2 shows a sectional view of an embodiment of a plate cylinder of an inventive printing press in which a printing plate precursor in the roll form is stored within the plate cylinder.

The present invention will be detailed below.

The printing plate precursor in the invention has a structure in which a part or all of a layer containing a water soluble material is removed to form image portions and non-image portions. The printing plate precursor in the invention has a structure of so-called "on-press development type". In the invention, the layer is removed by emulsion ink containing water, and particularly by dissolving the water soluble material in water contained in the emulsion ink. In the invention, removal of the layer may be carried out employing an external force such as tackiness of ink of an ink supply roller which is brought into contact with the layer or a blanket which is brought into contact with, and separated from the layer, while rotating the plate cylinder. These are carried out as a series of printing operation at initial printing, and on press development is not specifically required, in addition to the ordinary printing operation. An ink affinity or the lyophilic property of the layer containing a water soluble material increases by imagewise exposure. And the oil-based ink in the emulsion ink remains on the printing plate.

The preferred emulsion ink has a composition of an oil part to an aqueous part from 70/30 to 40/60 by weight. The oil-based inks which can be used in the present invention can be selected from any inks conventionally known. Examples of these are described in Japanese Patent Publication Open to Public Inspection No. 2000-7971.

The materials for the support of the present invention can be selected from any supports conventionally known in the graphic arts. Examples of the supports are metal plates, plastic plates, polyolefin resin coated papers, and composite supports of these. The thickness of the support is not specially limited as far as the support can be set to the printing press. However, preferred thickness of the plate is from 50 to 500 $\mu$m for the ease of handling.

Examples of the metal plates are an iron plate, a stainless steel plate and an aluminum plate. Of these, an aluminum plate is preferred considering its specific gravity value and rigidity. The typical aluminum plate for the invention is applied to an alkali, an acid or a solvent in order to remove an oil which remains on the surface of the plate. The oil is usually deposited during the rolling process and the take-up process. Further, it is preferable to apply an adhesion accelerating treatment or an under-coating treatment on the coating side of the plate in order to improve the adhesion property between the plate and the coating layer. Examples of the above-mentioned treatments are to immerse in a solution incorporating a coupling agent such as a salt of silicic acid or silane coupling agent, or to coat the solution incorporating a coupling agent and then drying. A combination of an anodic oxidation and above-mentioned immersion process or coating process can be applied to the plate. Because the anodic oxidation process can be considered as an adhesion accelerating treatment. An aluminum plate whose surface is grained with conventionally known method can also be used in the present invention.

Examples of plastic plates are polyethylene terephthalate, polyethylene naphthalate, polyimide, polyamide, polycarbonate, polysulfone, polyphenylene oxide and cellulose ester. Particularly preferred plastic plates are polyethylene terephthalate and polyethylene naphthalate. These plastic plates are preferably subjected to an adhesion accelerating treatment or under coating treatment on the coating side of the support in order to improve the adhesion property between the plate and the coating layer. Examples of the adhesion accelerating treatments are corona discharge treatment, plasma treatment and UV light irradiation. The layer containing gelatin or latex can be used as an under coating layer.

As the water soluble material, polysaccharides are preferably used. The polysaccharides will be described in detail later. Use of the polysaccharides can provide the characteristic, in which a quick rise in printing can be obtained without producing background contaminations. This characteristic is observed in printing carried out employing an ordinary ink and dampening water, but is markedly realized in printing carried out employing emulsion ink containing water in the invention.

The rise in printing herein referred to is determined by the number of prints printed from when printing starts to when prints having a good S/N ratio are obtained. The less the number, the better printability is.

One of the preferred embodiments of the printing plate precursors in the invention is a printing plate precursor comprising a support having thereon a hydrophilic layer and a layer containing a water soluble material and heat-fusible fine particles and/or thermoplastic fine particles in that order. Portions subjected to laser exposure of the layer containing a water soluble material is laser are insolubilized in water to form image portions, and unexposed portions the layer containing a water soluble material are removed to form non-image portions. Insolubilization in water in this case is caused by heat fusion of the heat-fusible fine particles and/or thermoplastic fine particles.

The water solubility of the water soluble material of the present invention is at least 1 g per 100 g of water at 25° C. The amount of the water soluble material is preferably from 5 to 95 weight % based on the weight of the layer incorporated.

As the water soluble material used in this embodiment, an oligosaccharide is preferable. The oligosaccharide has a good solubility in water, and on press development by water can be rapidly performed.

The oligosaccharide is a water-soluble crystalline substance generally having a sweet taste, which is formed by a dehydration condensation reaction of plural monosaccharide molecules. The oligosaccharide is one kind of o-glycoside having a saccharide as the aglycon. The oligosaccharide is easily hydrolyzed by an acid to form a several types of saccharides, and is classified according to the number of monosaccharide molecules of the resulting hydrolysis compounds, for example, into disaccharide, trisaccharide, tetrasaccharide, and pentasscharide. The oligosaccharide referred to in the invention means di- to deca-saccharides.

The oligosaccharide is classified into a reducing oligosaccharide and a non-reducing oligosaccharide according to presence or absence of a reducing group in the molecule. The oligosaccharide is also classified into a homo-oligosaccharide composed of the same kind of monosaccharide and a hetero-oligosaccharide composed of two or more kinds of monosaccharides.

The oligosaccharide naturally exists in a free state or a glycoside state. Moreover, various oligosaccharides are formed by transglycosylation by action of an enzyme.

The oligosaccharide frequently exists in a hydrated state in an ordinary atmosphere. The melting points of the hydrated one and anhydrous one are different from each other as shown in the following Table.

TABLE 1

| Kinds of oligosaccharide | | Melting point (° C.) Hydrates | Anhydrides |
|---|---|---|---|
| Raffinose | Trisaccharide | 80 (Pentahydrate) | 118 |
| Trehalose | Disaccharide | 97 (Dihydrate) | 215 |
| Maltose | Disaccharide | 103 (Monohydrate) | 108 |
| Galactose | Disaccharide | 119 (Monohydrate) | 167 |
| Sucrose | Disaccharide | None | 182 |
| Lactose | Disaccharide | 201 | 252 |

In the present invention, the layer containing a water soluble material is preferably formed by coating an aqueous coating solution containing the water soluble material on a support. When an oligossccharide in the layer formed from the aqueous coating solution is one capable of forming a hydrate, the melting point of the oligosaccharide is that of its hydrate.

Among the oligosaccharides, trehalose with comparatively high purity is available on the market, and has an extremely low hygroscopicity, although it has high water solubility, providing excellent storage stability and excellent development property on a printing press.

When oligosaccharide hydrates are heat melted to remove the hydrate water and solidified, the oligosaccharide is in a form of anhydride for a short period after solidification. Trehalose is characterized in that a melting point of trehalose anhydride is not less than 100° C. higher that that of trehalose hydrate. This characteristics provides a high melting point and reduced heat fusibility at exposed portions of the trehalose-containing layer immediately after heat-fused by infrared ray exposure and re-solidified, preventing image defects at exposure such as banding from occurring. In order to attain the object of the invention, trehalose is preferable among oligosaccharides. The oligosaccharide content of the layer is preferably from 1 to 90% by weight, and more preferably from 10 to 80% by weight, based on the total weight of the layer.

The heat-fusible fine particles used in the invention are ones having a low melt viscosity of thermoplastic materials, or particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 300° C. lowers ink receptive sensitivity.

Materials usable in the present invention include paraffin, polyolefin, polyethylene wax, microcrystalline wax, fatty acid ester wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearamide, linoleamide, lauramide, myristamide, hardened cattle fatty acid amide, palmitamide, oleamide, rice bran oil fatty acid amide, palm oil fatty acid amide, a methylol compound of the above-mentioned amide compounds, methylenebisstearamide and ethylenebisstearamide may be added to the wax to lower the softening point or to raise the working efficiency. A coumarone-indene resin, a rosin-modified phenol resin, a terpene-modified phenol resin, a xylene resin, a ketone resin, an acryl resin, an ionomer and a copolymer of these resins may also be usable.

Among them, polyethylene, microcrystalline wax, fatty acid ester and fatty acid are preferably contained. A high sensitive image formation can be performed since these materials each have a relative low melting point and a low melt viscosity. These materials each have a lubrication ability. Accordingly, even when a shearing force is applied to the surface layer of the printing plate precursor, the layer damage is minimized, and resistance to contaminations which may be caused by scratch is further enhanced.

The heat-fusible fine particles are preferably dispersible in water. The average particle size thereof is preferably from 0.01 to 10 μm, and more preferably from 0.1 to 3 μm. When a layer containing the heat-fusible fine particles is coated on the porous hydrophilic layer as described later, the particles having an average particle size less than 0.01 μm may enter the pores of the hydrophilic layer or the valleys between the neighboring two peaks on the hydrophilic layer surface, resulting in insufficient on press development and background contaminations. The particles having an average particle size exceeding 10 μm may result in lowering of dissolving power.

The composition of the heat-fusible fine particles may be continuously varied from the interior to the surface of the particles. The particles may be covered with a different material.

Known microcapsule production method or sol-gel method can be applied for covering the particles. The heat-fusible fine particle content of the layer is preferably 1 to 90% by weight, and more preferably 5 to 80% by weight based on the total layer weight.

The thermoplastic fine particles in the invention include thermoplastic hydrophobic polymer fine particles. Although there is no specific limitation to the upper limit of the softening point of the thermoplastic hydrophobic polymer particles, the softening point is preferably lower than the decomposition temperature of the polymer particles. The weight average molecular weight (Mw) of the polymer is preferably within the range of from 10,000 to 1,000,000.

Examples of the polymer consisting the polymer fine particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co) polymer or a (meth)acrylic acid (co)polymer such as polymethyl methacrylate, a methyl methacrylate-(2-ethylhexyl) acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer fine particles may be prepared from a polymer synthesized by any known method such as an emulsion polymerization method, a suspension polymerization method, a solution polymerization method and a gas phase polymerization method. The fine particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The thermoplastic polymer fine particles are preferably dispersible in water. The average particle size of the polymer fine particles is preferably from 0.01 to 10 μm, and more preferably from 0.1 to 3 μm. When a layer containing the thermoplastic fine particles having an average particle size less than 0.01 μm is coated on the porous hydrophilic layer as described later, the particles may enter the pores of the hydrophilic layer or the valleys between the neighboring two peaks on the hydrophilic layer surface, resulting in insufficient on press development and background contaminations. The thermoplastic fine particles having an average particle size exceeding 10 μm may result in lowering of dissolving power. Further, the composition of the thermoplastic polymer fine particles may be continuously varied from the interior to the surface of the particles. The particles may be covered with a different material.

As a covering method, known methods such as a microcapsule method and a sol-gel method are usable. The thermoplastic polymer fine particle content of the layer is preferably from 1 to 90% by weight, and more preferably from 5 to 80% by weight based on the total weight of the layer.

The coating amount of the layer containing a water soluble material in the printing plate precursor is preferably from 0.01 to 10 $g/m^2$, more preferably from 0.1 to 3 $g/m^2$ g and still more preferably from 0.2 to 2 $g/m^2$.

The hydrophilic layer in the invention is arranged between the support and the layer containing a water soluble material, and exhibits hydrophilicity. That is, when printing is carried out employing emulsion ink in which ink and water are mixed, the hydrophilic layer selectively accepts water. The hydrophilic layer is preferably porous. The porosity of the layer can be obtained by containing a porosity providing material such as a necklace-shaped colloidal silica or porous particles. It is preferable that the layer contains a light-heat conversion material as described later.

A preferable embodiment of the hydrophilic layer is one which contains an alkaline colloidal silica and the water-soluble polysaccharide, and has an uneven protruding surface structure having a pitch (i.e., the distance of peak to peak) of from 0.1 to 50 μm.

The layer preferably contains necklace-shaped colloidal silica as described later as the alkaline colloidal silica, and more preferably contains colloidal silica having an average size of not more than 100 nm.

It has been found that a suitable hydrophilic layer can be obtained when the hydrophilic layer is formed by an alkaline coating liquid, although the mechanism cannot be specified. Such a layer does not cause the background contamination when a lot of number of prints is printed.

The surface of the hydrophilic layer preferably has a uneven structure having a pitch of from 0.1 to 50 μm such as the grained aluminum surface of an aluminum PS plate. The water retention ability and the image maintaining ability is raised by the unevenness of the surface.

The uneven structure is preferably formed by coating a coating liquid for the hydrophilic layer containing the alkaline colloidal silica and the water-soluble polysaccharide so that the phase separation occurs at the time of drying the coated liquid, even though such a structure can also be formed by adding in an appropriate amount a filler having a suitable particle size to the coating liquid of the hydrophilic layer.

The shape of the uneven structure such as the pitch and the surface roughness thereof can be suitably controlled by the kinds and the adding amount of the alkaline colloidal silica, the kinds and the adding amount of the water-soluble polysaccharide, the kinds and the adding amount of another additive, a solid concentration of the coating liquid, a wet layer thickness or a drying condition.

The pitch of the uneven structure is preferably from 0.2 to 30 μm, and more preferably from 0.5 to 30 μm. A double uneven structure may be formed, in which an uneven structure having a smaller pitch is formed on an uneven structure having a larger pitch.

The surface roughness Ra is preferably from 100 to 1,000 nm, more preferably from 150 to 600 nm.

The thickness of the hydrophilic layer is preferably 0.01 to 50 μm, more preferably 0.2 to 10 μm, and most preferably 0.5 to 3 μm.

The following a to c are preferably usable as a porosity providing material. The use of necklace-shaped colloidal silica is particularly preferred. Plural kinds of the porosity providing material can be used in combination.

a. Necklace-shaped Colloidal Silica

The necklace-shaped colloidal silica is preferably used as the porosity providing material since the strength of the layer can be held and the porosity of the layer is maintained by addition of the necklace-shaped colloidal silica.

The necklace-shaped colloidal silica to be used in the invention is a generic term of an aqueous dispersion system of a spherical silica having a primary particle size of the order of nm. The necklace-shaped colloidal silica to be used in the invention means a "pearl necklace-shaped" colloidal silica formed by connecting spherical colloidal silica particles each having a primary particle size of from 10 to 50 μm so as to attain a length of from 50 to 400 nm. The term of "pearl necklace-shaped" means that the image of connected colloidal silica particles is like to the shape of a pearl necklace. The bonding between the silica particles forming the necklace-shaped colloidal silica is considered to be —Si—O—Si—, which is formed by dehydration of —SiOH groups located on the surface of the silica particles. Concrete examples of the necklace-shaped colloidal silica include Snowtex-PS series produced by Nissan Kagaku Kogyo, Co., Ltd.

The coating liquid of the hydrophilic layer is preferably alkaline. The examples of the Snowtex-PS series include Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively. Among them, the use of Snowtex-PS-S, Snowtex-PS-M or Snowtex-PS-L is particularly preferable since occurrence of background contamination is inhibited even when a lot of prints are printed.

In the invention, the alkaline necklace-shaped colloidal silica can be used in the hydrophilic layer having the uneven structure with a pitch of from 0.1 to 50 μm.

It is preferable to use the alkaline necklace-shaped colloidal silica to prevent the background contamination from occurring even when a lot of prints are printed.

b. Porous Silica or Porous Aluminosilicate Particles

Examples of an additive added to the hydrophilic layer include porous silica particles or porous aluminosilicate particles.

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combution of silicon tetrachloride together with hydrogen and oxygen to precipitate silica. The porosity and the particle size of such particles can be controlled by variation of the production conditions.

The porous silica particles prepared from the gel by the wet method is particularly preferred. For example, the porous aluminosilicate particles can be prepared by the method described in JP O.P.I. No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1. Complex particles composed of three or more components prepared by an addition of another metal alkoxide may also be used in the invention. In such a particle, the porosity and the particle size can be controlled by adjustment of the production conditions.

The porosity of the particles is preferably not less than 1.0 ml/g, more preferably not less than 1.2 ml/g, and most preferably of from 1.8 to 2.5 ml/g, in terms of pore volume before the dispersion.

The pore volume is closely related to water retention of the coated layer. As the pore volume increases, the water retention is increased, contamination is difficult to occur, and the water retention latitude is broad. Particles having a pore volume of more than 2.5 ml/g are brittle, resulting in lowering of durability of the layer containing them. Particles having a pore volume of less than 1.0 ml/g are insufficient in minimizing contamination at printing and brittle, and in broadening the water retention latitude.

The preferable particle size is substantially not more than 1 $\mu$m, and more preferably not more than 0.5 $\mu$m, in the state contained in the hydrophilic layer (including the case in which the particles are subjected to the dispersing and pulverizing processes). When larger particles exist, a porous and sharp projection is formed on the surface of the layer and ink tends to remain around the projection. As a result of that, contamination at the non-image portions tends to occur.

c. Zeolite Particles

Zeolite is a crystalline aluminosilicate, which is a porous material having voids of a regular three dimensional net work structure and having a pore size of 0.3 to 1 nm. Natural and synthetic zeolites are expressed by the following formula.

$$(M1\cdot(M2)_{1/2})m(\mathrm{Al}m\mathrm{Si}n\ \mathrm{O}_2)(m+n)\cdot x\mathrm{H_2O}$$

In the above, M1 and M2 are each exchangeable cations. Examples of M1 include $Li^+$, $Na^+$, $K^+$, $Tl^+$, $Me_4N^+$ (TMA), $Et_4N^+$ (TEA), $Pr_4N^+$ (TPA), $C_7H_{15}N^{2+}$, and $C_8H_{16}N^+$, and examples of M2 include $Ca^{2+}$, $Mg^{2+}$, $Ba^{2+}$, $Sr^{2+}$ and $(C_8H_{18}N)_2{}^{2+}$. Relation of n and m is $n \geqq m$, and consequently, the ratio of m/n, or that of Al/Si is not more than 1. A higher Al/Si ratio shows a higher content of the exchangeable cation, and a higher polarity, resulting in higher hydrophilicity. The Al/Si ratio is within the range of preferably from 0.4 to 1.0, and more preferably 0.8 to 1.0. x is an integer.

Synthetic zeolite having a stable Al/Si ratio and a sharp particle size distribution is preferably used as the zeolite particles to be used in the invention. Examples of such zeolite include Zeolite A: $Na_{12}(Al_{12}Si_{12}O_{48}).27H_2O$; Al/Si=1.0, Zeolite X: $Na_{86}(Al_{86}Si_{106}O_{384}).264H_2O$; Al/Si=0.811, and Zeolite Y: $Na_{56}(Al_{56}Si_{136}O_{384}).250H_2O$; Al/Si=0.412.

The hydrophilicity of the hydrophilic layer itself is considerably raised by containing the porous particles having an Al/Si ratio within the range of from 0.4 to 1.0, and contamination in the course of printing is inhibited and the water retention latitude also increases. Further, contamination caused by a finger mark is also considerably inhibited. When Al/Si is less than 0.4, the hydrophilicity is insufficient and the above-mentioned improving effects are lowered.

The preferable particle size is substantially not more than 1 $\mu$m, and more preferably not more than 0.5 $\mu$m, in the state contained in the hydrophilic layer (including the case in which the particles are subjected to the dispersing and pulverizing processes). When larger particles exist, a porous and sharp projection is formed on the surface of the layer and ink tends to remain around the projection. As a result of that, contamination at the non-image portions tends to occur.

Other than the above-mentioned, for example, metal oxide particles having an average particle size of not less than 100 nm and organic particles such as calcium alginate particles and crystallized cellulose particles may be used.

The content of such a porosity providing material is preferably from 30 to 95%, and more preferably from 50 to 90% by weight based on the whole weight of the hydrophilic layer.

The hydrophilic layer may contain metal oxide fine particles having an average particle size of not more than 100 nm. The metal oxide particles function as an inorganic binder in the hydrophilic layer. Examples of the metal oxide fine particles include a colloidal silica, an alumina sol, a titania sol and another metal oxide sol. The metal oxide fine particles may have any shape such as spherical, needle-like, and feather-like shape. The average particle size is preferably from 3 to 100 nm, and plural kinds of metal oxide each having a different size may be used in combination. The surface of the particles may be subjected to surface treatment.

The metal oxide fine particles can be used as a binder utilizing the layer forming ability thereof. The metal oxide fine particles are suitably used in the hydrophilic layer since lowering of the hydrophilicity of the layer is smaller than the use of the organic binder. Among the above-mentioned, the colloidal silica is particularly preferred since the layer forming ability is high under a drying condition with a relative low temperature.

The binding force of the colloidal silica is become larger with decrease of the particle size. The average particle size of the colloidal silica to be used in the invention is preferably from 1 to 50 nm, and more preferably 3 to 20 nm. As above-mentioned, an alkaline colloidal silica shows the effect of inhibiting occurrence of the background contamination. Accordingly, the use of the alkaline colloidal silica is particularly preferable.

Examples of alkaline colloidal silica having the average particle size within the foregoing preferable range include Snowtex-20 (average particle size: 10 to 20 nm), Snowtex-30 (average particle size: 10 to 20 nm), Snowtex-40 (average particle size: 10 to 20 nm), Snowtex-N (average particle size: 10 to 20 nm), Snowtex-S (average particle size: 8 to 11 nm) and Snowtex-XS (average particle size: 4 to 6 nm), each produced by Nissan Kagaku Co., Ltd.

The ratio of the foregoing porosity providing material to the metal oxide fine particles having an average particle size of not more than 100 nm is preferably from 95/5 to 5/95, more preferably from 80/20 to 20/80, and most preferably from 70/30 to 30/70.

The water-soluble polysaccharide in the invention include starches, celluloses and polyuronic acid. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

When such a cellulose derivative is dissolved in water together with the alkaline necklace-shaped colloidal silica or/and the colloidal silica having an average particle size of not more than 100 nm, phase generation is accompanied with an increase of the solid concentration caused by coating and drying, so that the surface having the regular uneven structure can be formed.

The addition amount of the cellulose derivative is preferably from 0.1 to 10%, more preferably from 0.5 to 5% by weight based on the whole weight of the solid components contained in the coating liquid. The uneven structure formation is not realized when the addition amount is less than 0.1% by weight, and the water resistance of the dried layer is lowered when the addition amount is more than 10% by weight.

As a light-heat conversion material, a material having an ability of converting infrared rays to heat, namely one having an absorption band within the near infrared to infrared region is used. The infrared region is a wavelength of not less than 700 nm, and preferably 750 nm. The material absorbing a wavelength of not less than 750 nm is particularly preferred for CTP employing an infrared laser exposure.

Examples of the light-heat conversion material include an organic compound such as a cyanine dye, a chloconium dye, a polymethine dye, an azulenium dye, a squalenium dye, a thiopyrylium dye, a naphthoquinone dye or an anthraquinone dye, each being an ordinary infrared absorbing dye, and an organometallic complex such as a phthalocyanine compound, a naphthalocyanine compound, an azo compound, a thioamide compound, a dithiol compound or an indoaniline compound. Exemplarily, the light-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

When the layer containing the light-heat conversion material is coated in a form of aqueous coating liquid, the use of a water-soluble dye provides a high light-heat conversion efficiency since such a dye can be uniformly dispersed in the layer without coagulation. In contrast, it is preferred that a water-insoluble dye is uniformly dispersed in a form of fine particles having an average particle size of not more than 1 $\mu$m, and more preferably not more than 0.5 $\mu$m.

The addition amount of the dye is preferably from 0.1 to 10% by weight, and more preferably from 1 to 5% by weight based on the total weight of the layer.

Examples of pigment having an absorption in the infrared regions include, carbon, graphite, metal and a metal oxide.

Furnace black and acetylene black is preferably used as the carbon. The graininess (d50) thereof is preferably not more than 100 nm, and more preferably not more than 50 nm. The graphite is one having a particle size of preferably not more than 0.5 $\mu$m, more preferably not more than 100 nm, and most preferably not more than 50 nm.

The carbon or graphite is preferably used in a form of preliminarily prepared aqueous dispersion since such a material is difficult to be dispersed in the coating liquid. The aqueous dispersion may contain a dispersing agent other than the carbon or the graphite. The coating liquid for the hydrophilic layer is preferably alkaline. It is preferable that the aqueous dispersion added to the coating liquid is preliminarily alkalified. For example, "HITASOL" series produced by Hitachi Funmatsu Yakin Co., Ltd. are preferable which are aqueous graphite dispersions alkalified by ammonia.

As the metal, any metal can be used as long as the metal is in a form of fine particles having preferably a particle size of not more than 0.5 $\mu$m, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials which are electro-conductive or semi-conductive can be used.

Examples of the former include black iron oxide ($Fe_3O_4$), and black complex metal oxides containing at least two selected from copper, chromium, iron, manganese, cobalt, nickel, zinc, antimony, titanium, and barium. Examples of a combination of main metals in the black complex metal oxides include Cu—Cr, Cu—Cr—Mn, Cu—Mn, Cu—Fe—Mn, Co—Cr—Fe, Co—Cr—Fe—Mn, and Co—Ni—Cr—Fe.

Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3 \cdot 2B_2O$ and $K_2O \cdot nTiO_2$ with these metal oxides is usable. The particle size of these particles is preferably not more than 0.5 $\mu$m, more preferably not more than 100 nm, and most preferably not more than 50 nm. Among them, black complex metal oxides or titanium black are particularly preferred.

The layer may contain other materials as described below.

Water-soluble Resin

Examples of the water-soluble resin include polyethylene oxide, polypropylene oxide, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone.

A cationic resin may also be contained in the layer. Examples of the cationic resin include a polyalkylene-polyamine or a derivative thereof such as a polyethylene-amine and polypropylenepolyamine, an acryl resin having a tertiary amino group or a quaternary ammonium group and diacrylamine. The cationic resin may be added in a form of fine particles. Examples of such particles include the cationic microgel described in Japanese Patent O.P.I. Publication No. 6-161101.

A crosslinking agent may be added to the layer. Examples of the crosslinking agent include a melamine resin, an isocyanate compound, an isooxazole compound, an aldehyde compound, an N-methylol compound, a dioxane derivative, a reactive vinyl compound and a reactive halogen compound.

Matting Agent

The porous particles as described above can be used as a matting agent. to the hydrophilic layer B. Furthermore, inorganic particles having a new Mohs' hardness of not less than 5 may be added to enhance an abrasion resistance of the hydrophilic layer. Examples of the inorganic particles having a new Mohs' hardness of not less than 5 include non-porous metal oxide particles such as particles of silica, alumina, titania, zirconia, iron oxide and chromium oxide; particles of metal carbides such as silicon carbide; boron nitride particles; and diamond particles. Particles having no sharpened corner are preferable, for example, approximately spherical particles such as molten silica particles and shirasu-balloon particles are preferred.

As an indicator of the non-porosity of the matting agent, the specific surface area is preferably not more than 50 $m^2/g$, and more preferably not more than 10 $m^2/g$, in terms of a BET value.

The average particle size is preferably from 1 to 2, more preferably from 1.1 to 1.5, times of the thickness of the hydrophilic layer. It is preferable that the particles have a narrow size distribution, and that not less than 60% of the total particles have a particle size of from 0.8 to 1.2 times of the average particle size. Moreover, it is preferable that the particles having a particle size of 2 times of the average diameter account for not more than 5% of the total particles.

The content of the inorganic particles having a new Mohs' hardness of not less than 5 is preferably from 0.1 to 20% by weight, and more preferably from 0.5 to 10% by weight based on the whole weight of the hydrophilic layer.

Layer Structural Mineral Particles

Layer structural mineral particles may be contained in the hydrophilic layer. Examples of the layer structural mineral particles include a clay mineral such as kaolinite, halloysite, talc, smectite such as mommolinite, beidellite, hectorite and saponite, vermiculite, mica or chlorite, hydrotalcite and layer structural polysilicates such as kanemite, makatite, ilerite, magadiite and kenyte. Among them, ones having a higher electric charge density of the unit layer are considered to be higher in the polarity and in the hydrophilicity. Preferable charge density is not less than 0.25, and more preferably not less than 0.6. Examples of the layer structural mineral having such a charge density include smectite (having a negative charge density of from 0.25 to 0.6) and bermiculite (having a negative charge density of from 0.6 to 0.9). Synthesized fluorinated mica is preferable, since one having a stable quality, for example, a stable particle size, is available. Among the synthesized fluorinated mica, swellable one is preferable and freely swellable one is more preferable.

An intercalation compound of the foregoing layer structural minerals such as a pillared crystal, one subjected to ion exchange treatment and one subjected to surface treatment (such as a silane coupling treatment and a complication treatment with an organic binder) are also usable.

The flat plate-shaped layer structural mineral particles are preferably particles having an average particle size (an average of the largest length) of preferably not more than 20 μm, and an average aspect ratio (the largest length of particles/the thickness of particles) of preferably not less than 20, and more preferably particles having an average particle size of preferably not more than 10 μm, and an average aspect ratio of preferably not less than 50, in a state contained in the layer (including the particles subjected to swelling processing and dispersion-separation processing). When the particle size falls within the foregoing range, continuity to the horizontal direction or flexibility, which is characteristics of the layer structural particles, is given to the coated layer so that a strong coated layer in which cracks are difficult to form can be obtained. When the particle size falls outside the foregoing range, scratch resistance of the layer may be lowered. When the aspect ratio is lower than the foregoing lower limit, the scratch resistance may also be lowered, since flexibility of the layer becomes insufficient.

The content of the layer structural mineral particles is preferably from 1 to 95% by weight, and more preferably from 3 to 80% by weight based on the total weight of the layer. Particularly, swellable synthesized fluorinated mica, which is extremely thin, is effective even when the addition amount is small. The layer structural mineral particle may be added after subjected to dispersion-separation processing or swelling processing described later.

Aqueous Silicate Solution as a Binder

An aqueous silicate solution is also usable as a binder to be added to the hydrophilic layer. An alkali metal (M) silicate such as sodium silicate, potassium silicate or lithium silicate is preferable, and the $SiO_2/M_2O$ ratio in the coating liquid containing the silicate is preferably selected so that the pH value of the liquid is not more than 13 in preventing dissolution of the inorganic particles.

Inorganic or organic-inorganic hybrid polymer prepared by a sol-gel method as a binder An inorganic polymer or an inorganic-organic hybrid polymer prepared by so-called a sol-gel method can be used as a binder to be added to the hydrophilic layer. Known methods described in S. Sakka, "Application of Sol-Gel Method" published by Agneshofu Co., Ltd. or in the publications referred in the above publication can be applied as a method of preparing an inorganic polymer or an inorganic-organic hybrid polymer according to the sol-gel method.

Surfactant

A water-soluble surfactant may be added for improving coatability of the coating liquid. A silicon-containing surfactant and a fluorine-containing surfactant are preferably used. The content of the surfactant is preferably from 0.01 to 3% by weight, and more preferably from 0.03 to 1% by weight based on the total weight of the hydrophilic layer.

Content of the Organic Components

The foregoing organic components contained in the hydrophilic layer, even if they are hydrophilic resins, lower the hydrophilicity of the layer, resulting in contamination of the print, when the layer is subjected to crosslinking processing in order to increase durability and the water resistance of the layer. Moreover, the organic components block the openings of the porous particles or immerse into the pores to degrade the porosity, which may result in lowering of the water-retention property. Consequently, the adding amount of the organic component is preferably smaller. The organic component content of the hydrophilic layer is preferably from 0.1 to 50% by weight, more preferably from 1 to 30% by weight, and most preferably from 1 to 20% by weight based on the whole weight of the hydrophilic layer.

The printing plate precursor as described in item 7 is one in which laser-exposed portions of the ablating layer are ablated together with the hydrophilic layer on the exposed portions to reveal the surface of a layer or support beneath the exposed portions, which forms an image receiving printing ink. The layer containing a water soluble material serves as a protective layer for preventing the ablating layer from scattering, and all of the layer is removed to obtain a printing plate.

When polyvinyl alcohol is used in the layer containing a water soluble material as described in U.S. Pat. No. 6,095,048, the ordinary printing method continuously supplying dampening water has the problem in that the background contaminations are likely to occur at the beginning of printing or contaminations resulting from finger contact on the surface of the printing plate are likely to occur. In order to overcome such a problem, a printing method is carried out employing dampening water containing alcohol to reduce various contaminations to non-problematic level.

The contaminations as described above markedly occur when emulsion ink is used as a printing ink. In the combined use of the printing plate precursor comprising a porous hydrophilic layer, one embodiment of the preferred in the invention with emulsion ink, there is a big problem in that contaminations occurring at the beginning of printing remain after several thousands of prints are printed.

In the invention, the combination of the layer containing a polysaccharide as a water soluble material and a porous hydrophilic layer makes it possible to prevent contaminations from occurring in a printing method employing emulsion ink.

As the polysaccharide starches, celluloses and polyuronic acid can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

The coating amount of the layer containing the water soluble polymer is preferably from 0.01 to 10 g/m$^2$, more preferably from 0.1 to 5 g/m$^2$, and still more preferably from 0.3 to 3 g/m$^2$.

In the printing plate precursor as described in item 7 above, the layer containing a water soluble material may further contain a matting agent or lubricants (such as heat-fusible fine particles and the surfactant as described above).

In the printing method of the invention, water need not to be supplied to the surface of the printing plate, since emulsion ink employed contains water. However, water may be supplied in advance to the surface of the printing plate before the beginning of printing, in order to promote initial printing, that is, to reduce loss of prints. The water supplying method does not require a strict water supplying system, a continuously water supplying system ordinarily used (for example, a uniform supply in the transverse direction of the printing plate, a supplying amount adjusting system, water circulation, filtration, temperature control, etc.). The above object can be attained by only spraying water to the printing plate.

In the invention, the ratio of a water supply amount W (g/m$^2$) before printing to a coating amount Q (g/m$^2$) of the layer containing the water soluble material in the printing plate precursor satisfies preferably $0.1 \leqq W/Q \leqq 50$, and more preferably $0.5 \leqq W/Q \leqq 20$. The ratio less than 0.1 cannot give the effect of promoting initial printing, and the ratio more than 50 produces undesired water flow on the printing plate.

The printing methods of the invention include one comprising the steps of mounting a printing plate precursor on a plate cylinder of a printing press, imagewise exposing the mounted plate precursor, and then carrying out printing while supplying emulsion ink to the exposed plate precursor.

Exposure applied in the invention is preferably scanning exposure, which is carried out employing a laser which can emit light having a wavelength of infrared and/or near-infrared regions, that is, a wavelength of from 700 to 1500 nm. As the laser, a gas laser can be used, but a semi-conductor laser, which emits light having a near-infrared region wavelength, is preferably used.

A device suitable for the scanning exposure in the invention may be any device capable of forming an image on the printing plate precursor according to image signals from a computer employing a semi-conductor laser.

Generally, the scanning exposures include the following processes.

(1) a process in which a plate precursor provided on a fixed horizontal plate is scanning exposed in two dimensions, employing one or several laser beams.

(2) a process in which the surface of a plate precursor provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) a process in which the surface of a plate precursor provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the invention, the process (3) above is preferable, and especially preferable when a printing plate precursor mounted on a plate cylinder of a printing press is scanning exposed.

As the process (3), a process as disclosed in, for example, Japanese Patent O.P.I. Publication No. 5-131676, can be used. Plural semi-conductor lasers are arranged in one line in the sub-scanning direction at a certain beam pitch, or plural semi-conductor lasers are arranged at a certain beam pitch in the sub-scanning direction and at certain intervals in the main scanning direction, that is, in two dimensions. The spot size of plural laser beams emitted from these semi-conductor lasers are reduced through an optical system comprising an optical fiber, a lens or a mirror so that the laser beams are focused on the plate precursor surface, and accordingly, the surface of the plate precursor is exposed with the reduced beam spots so as to give a predetermined exposure dissolving power. When the semi-conductor lasers are arranged in two dimensions, exposure of the plate precursor surface to the reduced beam spots is also carried out in two dimensions, and therefore, emission of each laser located in the main scanning direction is required to be delayed according to a generated image signal.

The sub-scanning of the laser light is generally carried out by moving an exposure head in the direction parallel to the rotational drum axis by a distance equal to a laser spot size multiplied by the laser beam number per one rotation of the drum. The exposure head may move at a constant speed from the beginning of the exposure till completion thereof, while controlled through a reference signal generated by rotation of the drum, that is, a spiral exposure may be carried out. The exposure head, when passing the part (generally, between the both ends of the plate precursor) on the drum at which the plate precursor is not present, may intermittently move by a predetermined distance. Further, a method as is disclosed in JPA-11-133620 may be used, which comprises a system countering a tendency for the laser beam to incline in the sub-scanning direction, while conducting spiral exposure.

Figure 3:
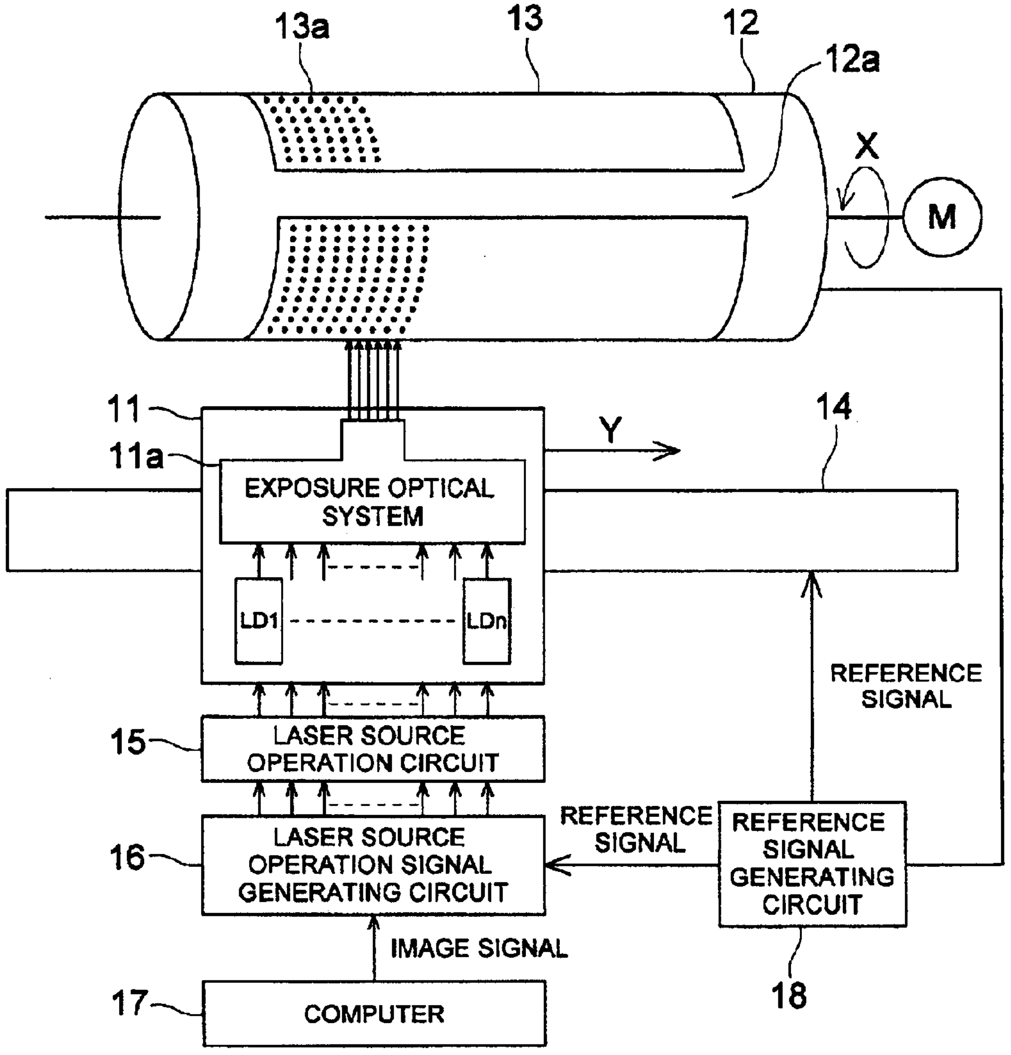
FIG. 3 shows a schematic view of a scanning exposure system used in the invention.

FIG. 3 shows a schematic view of one embodiment of a scanning exposure system comprising n semi-conductor laser sources. The exposure system comprises a rotational drum 12 and an exposure head 11 connected to a moving member 14 which can move exposure head 11 in the direction parallel to the rotational axis of rotational drum 12, that is, in the sub-scanning direction (shown by an arrow "Y" in FIG. 3). An arrow "X" in FIG. 3 shows a rotational direction (the main scanning direction of a drum 12, and M shows a driving motor of a drum 12. The exposure head 11 comprises n semi-conductor laser sources LD1 through LDn and an exposure optical system 11*a* which makes it possible to expose the surface of a printing plate precursor 13 to each laser beam of a predetermined beam spot size at a predetermined position relationship. A laser source operation signal generating circuit 16 receives both an image signal from a computer 17 and a reference signal generated by a reference signal generating circuit 18 responding to rotation of the drum, and generates a laser source operation signal. A laser source operation circuit 15 receives the generated laser source operation signal and operates each of the semi-conductor laser sources LD1 through LDn, separately, whereby the surface of a printing plate precursor 13 is imagewise scanning exposed. Numerical number 13*a* shows portions having been exposed of the printing plate precursor 13. Moving member 14 also receives the standard signal and moves the exposure head in the sub-scanning direction by a given distance (by n dots) per one rotation of the rotational drum 12. As described above, this movement may be carried out at a constant speed from the beginning of the exposure till completion thereof, and the exposure head, when passing the portion 12*a* on the drum at which the plate precursor is not present, may intermittently move by a predetermined distance.

Examples of the printing press of the invention include a compact printing press comprising an exposure system employing an infrared laser capable of directly forming an image on the plate precursor mounted on a plate cylinder but no conventional continuous water supply system. The printing press of the invention is preferably a printing press comprising a simple water supply system as a system for supplying water to the exposed printing plate precursor before printing is carried out. The simple water supply system is preferably a system in which the system does not substantially contact ink. Such a system is free from contamination of the water supply system due to ink, and makes it possible to repeatedly carry out exposure and printing without deterioration of the rise in printing.

One embodiment of the simple water supply system in the invention is a simple water supply roller. It does not require a strict water supply amount control system or dampening water circulation system installed in a continuous water supply device, which provides a compact structure. The printing method employing this compact structure preferably comprises the steps of bringing a simple water supply roller into contact with the surface of an exposed printing plate precursor while rotating the plate cylinder to supply a predetermined amount of water onto the printing plate precursor surface, separating the simple water supply roller from the printing plate precursor surface, and then carrying out (starting) printing by bringing an ink supply roller into contact with the surface of the printing plate precursor.

Another embodiment of the simple water supply system in the invention is a water sprayer. The water sprayer may be a device capable of simultaneously spraying water over the width (in the direction parallel to the rotational axis of the plate cylinder) substantially equal to that of the printing plate precursor, or a device spraying water over the width smaller than that of the printing plate precursor.

The water sprayer is one which blows water on the surface of the printing plate precursor by spraying. The water sprayer capable of simultaneously spraying water over the width substantially equal to that of the printing plate precursor, being fixed, can uniformly supply a given amount of water onto the entire surface of the printing plate precursor. The water sprayer, whose water spraying width is smaller than the width of the printing plate precursor, can uniformly supply a given amount of water onto the entire surface of the printing plate precursor by scanning the sprayer in the direction parallel to the rotational axis of the plate cylinder.

Figure 4:
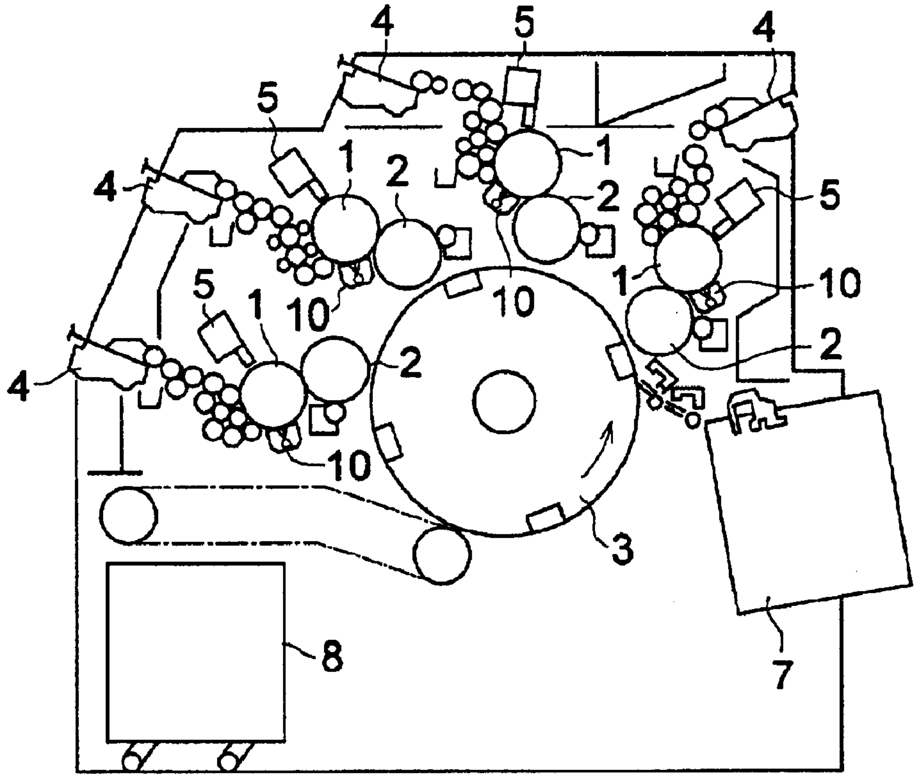
FIG. 4 shows a schematic view of an inventive printing press comprising a scanning exposure system and a water spraying device as a water supply system.

FIG. 4 shows a printing press of the invention installed with a water sprayer 10 as a water supply system. A compact structure can be obtained without great change by replacing a surface cleaning device 6 for cleaning the surface of the printing plate with water sprayer 10. The printing method of the invention comprising employing the printing plate precursor and emulsion ink can eliminate a process of cleaning the printing plate surface after exposure, and carry out immediate printing with reduced loss of printed matter, which results in great reduction of running cost in printing.

EXAMPLES

Example 1

1. Preparation of Printing Plate Precursor a. Support

A subbing layer comprised of two layers was coated on a 0.18 mm thick PET film according to the following procedures to obtain a support.

1) First subbing layer

The surface of the PET film was corona discharged, and the following coating solution was coated onto the discharged surface by a wire bar at 20° C. and 55% RH to obtain a first subbing layer with a dry thickness of 0.4 $\mu$m, and dried at 140° C. for 2 minutes.

(Composition of First Subbing Layer Coating Solution)

| | |
|---|---|
| Acryl latex particles (n-butyl acrylate/t-butyl acrylate/styrene/hydroxyethyl methacrylate (=28/22/25/25) copolymer) | 36.9 g |
| Surfactant (A) | 0.36 9 |
| Hardener (a) | 0.98 g |

Distilled water was added to the above composition to make 1,000 ml to obtain a first subbing layer coating solution.

2) Second Subbing Layer

The surface of the first subbing layer was corona discharged, and the following coating solution was coated onto the discharged surface by an air knife method at 35° C. and 22% RH to obtain a second subbing layer with a dry thickness of 0.1 $\mu$m, and dried at 140° C. for 2 minutes. (Thus, a support was obtained.)

(Composition of Second Subbing Layer Coating Solution)

| | |
|---|---|
| Gelatin | 9.6 g |
| Surfactant (A) | 0.4 g |
| Hardener (b) | 0.1 g |

Distilled water was added to the above composition to make 1,000 ml to obtain a second subbing layer coating solution.

Surfactant (A)

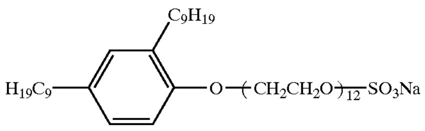

Hardener (a)

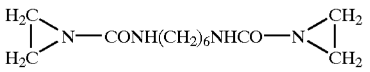

Hardener (b)

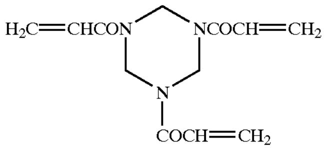

b. Preparation of Printing Plate Precursor (A)

A hydrophilic layer coating solution having the following composition was filtered, then coated on the subbing layer on one side of the above obtained support by a #10 wire bar, and dried at 80° C. for 5 minutes.

| | |
|---|---|
| Colloidal silica (alkali type) Snowtex S (solid 30% by weight, produced by Nissan Kagaku Co., Ltd.) | 30.0 parts by weight |
| Necklace shaped colloidal silica (alkali type) Snowtex PSM (solid 20% by weight, produced by Nissan Kagaku Co., Ltd.) | 50.0 parts by weight |
| Matting agent Silton AMT 08 (porous alumino-silicate particles having an average particle size of 0.6 μm, produced by Mizusawa Kagaku Co., Ltd.) | 6.0 parts by weight |
| Graphite aqueous dispersion solution, HITASOL GA-66M (Solid content 10% by weight, produced by Hitachi Funmatsuyakin Co., Ltd.) | 14.0 parts by weight |

Deionized water was added to the above composition to give a solid content of 20% by weight, and sufficiently mixed with stirring.

A layer coating solution having the following composition comprising a water soluble resin and heat fusible fine particles was filtered, then coated on the above obtained hydrophilic layer by a #4 wire bar, and dried at 55° C. for 5 minutes to give a layer coating amount of 0.6 g/$m^2$.

| | |
|---|---|
| Aqueous 5% by weight solution of disaccharide trehalose powder (Trehaose, mp. 97° C., produced by Hayashihara Shoji Co., Ltd.) | 55.0 parts by weight |
| Emulsion obtained by diluting, with deionized water, Carnauba wax emulsion A118 (having a solid content of 40% by weight, the wax having an average particle size of 0.3 μm, a melting viscosity at 140° C. of $8 \times 10^{-3}$ P · s, a softening point of 65° C., and a melting point of 80° C., produced by GifuCerac Co., Ltd.) to give a solid content of 6% by weight | 45.0 parts by weight |

The resulting material was aged at 55° C. for 24 hours to obtain a printing plate precursor (A).

c. Preparation of Printing Plate Precursor (B)

A ablating layer coating solution having the following composition was filtered, then coated on the above obtained support by a #10 wire bar, and dried at 55° C. for 5 minutes.

| | |
|---|---|
| Colloidal silica (alkali type) Snowtex S (solid 30% by weight, produced by Nissan Kagaku Co., Ltd.) | 30.0 parts by weight |
| Necklace shaped colloidal silica (alkali type) Snowtex PSM (solid 20% by weight, produced by Nissan Kagaku Co., Ltd.) | 30.0 parts by weight |
| Carnauba wax emulsion A118 (having a solid content of 40% by weight, the wax having an average particle size of 0.3 μm, a melting viscosity at 140° C. of 8 cps, a softening point of 65° C. and a melting point of 80° C., produced by GifuCerac Co., Ltd.) | 20.0 parts by weight |
| Carbon black aqueous dispersion SD9020 (Solid content of 30% by weight, produced by Dainippon Ink Co., Ltd.) | 20.0 parts by weight |

Deionized water was added to the above composition to give a solid content of 10% by weight, and sufficiently mixed with stirring.

A hydrophilic layer coating solution having the following composition was filtered, then coated on the above obtained ablating layer by a #4 wire bar, and dried at 55° C. for 5 minutes.

| | |
|---|---|
| Colloidal silica (alkali type) Snowtex XS (solid content 20% by weight, produced by Nissan Kagaku Co., Ltd.) | 50.0 parts by weight |
| Necklace shaped colloidal silica (alkali type) Snowtex PSM (solid content 20% by weight, produced by Nissan Kagaku Co., Ltd.) | 47.0 parts by weight |
| Matting agent Silton AMT 08 (porous aluminosilicate particle shaving an average particle size of 0.6 μm, produced by Mizusawa Kagaku Co., Ltd.) | 2.0 parts by weight |

Deionized water was added to the above composition to give a solid content of 10% by weight, and sufficiently mixed with stirring.

A layer coating solution comprising carboxymethyl cellulose sodium salt in an amount of 3% by weight as a water soluble resin was filtered, then coated on the above obtained hydrophilic layer by a #5 wire bar, and dried at 55° C. for 5 minutes to give a coating amount of 0.3 g/$m^2$. The resulting material was aged at 55° C. for 24 hours to obtain a printing plate precursor (B).

2. Preparation of Emulsion Ink

Emulsion ink having a water content of 40% by weight for off-set printing was prepared in the same manner as in Example 1 of Japanese Patent Publication Open to Public Inspection No. 2000-7971.

The emulsion ink was prepared as follows.

| | |
|---|---|
| Denaturated phenol resin varnish with rosin | 25 parts by weight |
| Gilsonite varnish | 12 parts by weight |
| Petroleum resin varnish | 12 parts by weight |
| Carbon black #32 (made by Mitsubishi Chemical Corporation) | 20 parts by weight |
| Anti-drying agent | 1 parts by weight |

These were mixed using bead mill to obtain a black ink base. Then the black ink base was mixed with another components indicated as follows.

| | |
|---|---|
| Black ink base | 70 parts by weight |
| Petroleum resin varnish | 24 parts by weight |
| No. 6 solvent | 4.5 parts by weight |
| Tridecanol | 1 parts by weight |
| Polyoxyethylene nonylphenyl ether (average 7.5 mol of ethylene oxide adduct) | 0.5 parts by weight |

The above-described ingredients were mixed to yield an offset ink having a viscosity of 3.3 to 3.5 Pa·s.

The emulsion ink (40% water content) was prepared by mixing 60 parts by weight of the offset ink and 40-parts by weight of water.

(Exposure Method)

The printing plate precursor obtained above was wound around the drum of a laser exposure system with the image forming layer facing outwardly, and were imagewise exposed to an infrared laser (having a wavelength of 830 nm) at a resolving degree of 4,000 dpi (with the laser light spot diameter being 6 $\mu$m). The exposure amount was 250 mj/cm$^2$ at the surface of the plate precursor (A) and 400 mj/cm$^2$ at the surface of the plate precursor (B). The term, "dpi" shows the number of dots per 2.54 cm. Thus, comparative printing plate 1 was prepared.

Printing Method (1)

As a printing press, DAIYA 1F-1 produced by Mitsubishi Jukogyo Co., Ltd., was employed. Printing was carried out employing a coated paper, dampening water (H solution SG-51 with a concentration of 1.5%, produced by Tokyo Ink Co., Ltd.), and printing ink (Toyo King Hyecho M Magenta, produced by Toyo Ink Manufacturing Co.). The same printing method as a conventional one was carried out by bringing an ink supply roller into contact with the printing plate precursor after bringing dampening water supply roller into contact with the printing plate precursor, while supplying dampening water.

Reference Example 1

Employing the exposed printing plate precursor (A), printing was carried out according to the printing method (1).

The number of prints for the rise in printing (the number of prints printed from when printing starts to when prints having a good S/N ratio are obtained) was 20.

Reference Example 2

Printing was carried out in the same manner as in Reference example 1, except that the exposed printing plate precursor (B) was used instead of the exposed printing plate precursor (A). The number of prints for the rise in printing was 20.

Printing Method (2)

As a printing press, DAIYA 1F-1 produced by Mitsubishi Jukogyo Co., Ltd., was employed. Printing was carried out employing the above described emulsion ink and without employing dampening water.

Example 2

Employing the exposed printing plate precursor (A), printing was carried out according to the printing method (2). The number of prints for the rise in printing was 25.

Example 3

Printing was carried out in the same manner as in Example 2, except that the exposed printing plate precursor (B) was used instead of the exposed printing plate precursor (A). The number of prints for the rise in printing was 25.

Printing Method (3)

As a printing press, DAIYA 1F-1 produced by Mitsubishi Jukogyo Co., Ltd., was employed. Printing was carried out employing a coated paper, and printing ink (Toyo king Hyecho M Magenta, produced by Toyo Ink Manufacturing Co.), but without employing dampening water.

Comparative example 1

Employing the exposed printing plate precursor (A), printing was carried out according to the printing method (3). The entire surface of the printing plate precursor (A) was inked, and an image could not be formed.

Comparative example 2

Printing was carried out in the same manner as in comparative example 1, except that the exposed printing plate precursor (B) was used instead of the exposed printing plate precursor (A). The entire surface of the printing plate precursor (B) was inked, and an image could not be formed.

Printing Method (4)

As a printing press, DAIYA 1F-1 produced by Mitsubishi Jukogyo Co., Ltd., was employed. Printing was carried out employing a coated paper, dampening water (H solution SG-51 with a concentration of 1.5%, produced by Tokyo Ink Co., Ltd.), and the above described emulsion ink. Printing was carried out without supplying dampening water by bringing an ink supply roller into contact with the printing plate precursor after bringing dampening water supply roller into contact with the printing plate precursor to supply the dampening water onto the printing plate precursor during three rotations of the plate cylinder, and then separating the dampening water supply roller from the printing plate precursor. The dampening water supply amount was the same proper amount as in printing method (1).

Example 4

Employing the exposed printing plate precursor (A), printing was carried out according to the printing method (4). The number of prints for the rise in printing was 20.

Example 5

Employing the exposed printing plate precursor (A), printing was carried out according to the printing method (2), provided that before printing, pure water was uniformly sprayed onto the surface of the plate precursor in an average supply amount of 1 g/m$^2$, while rotating the plate cylinder. The number of prints for the rise in printing (the number of prints printed from when printing starts to when prints having a good S/N ratio are obtained) was 20.

Example 6

Printing was carried out in the same manner as in Example 5, except that pure water was uniformly sprayed onto the surface of the plate precursor in an average supply amount of 5 g/M$^2$. The number of prints for the rise in printing was 20.

As is apparent from the above, according to the printing method of the invention, printing can be carried out with a quick rise in printing, employing a printing plate precursor capable of being on press developed and without employing dampening water.

A DI printing press for a printing plate precursor capable of being on-press developed with dampening water on the press can be small-sized according to the printing method of the invention. Further, even a printing press designed for a waterless printing plate precursor, for example, Quickmaster-46-DI produced by Heiderberg Co., Ltd or 3404DI produced by Ryobi Co., Ltd., makes it possible to employ the printing plate precursor capable of being on-press developed with dampening water on the press.

The present invention can provide a printing method employing a printing plate precursor employing dampening water which provides reduced running cost, and does not require a high degree of skill, and provide a printing press for a printing plate precursor employing dampening water which is capable of being small-sized, reduces running cost, and does not require a high degree of skill.

What is claimed is:

1. A method of printing an image with a printing plate prepared from a printing plate precursor, which comprises a support having thereon an image forming layer A containing a water-soluble material, the method comprising the steps of:

(a) imagewise exposing the layer A of the printing plate precursor so as to form an unexposed portion and an exposed portion;

(b) supplying an emulsion ink containing an oil-based ink and water onto the layer A so that the unexposed portion is removed from the layer A so as to form a non image portion and the exposed portion remains in the layer A so as to form an image portion to give the printing plate, wherein the image portion is lyophilic and the non image portion is hydrophilic; and (c) printing the image on the printing plate to an image receiving material while further supplying the emulsion ink.

2. The method of claim 1, wherein the water-soluble material in the layer A is a saccharide.

3. The method of claim 1, wherein the printing plate precursor further comprises a hydrophilic layer B between the support and the layer A, wherein the layer A further comprises heat-fusible particles or thermoplastic particles.

4. The method of claim 3, wherein the water-soluble material in the layer A is an oligosaccharide.

5. The method of claim 3, wherein the hydrophilic layer B is a porous layer.

6. The method of claim 3, wherein the hydrophilic layer B further comprises a light-heat conversion material.

7. The method of claim 1, wherein the printing plate precursor further comprises a layer C which is capable of being ablated and a hydrophilic layer B on the support in that order, the layer A being located on the layer B.

8. The method of claim 7, wherein the water-soluble material in the layer A is a polysaccharide.

9. The method of claim 1, wherein the printing is carried out without supplying water on the surface of the printing plate during printing.

10. The method of claim 1, wherein water is supplied on the surface of the printing plate precursor prior to supplying the emulsion ink on the surface of the printing plate precursor.

11. The method of claim 10, wherein water is supplied with a water spraying device on the surface of the printing plate precursor.

12. The method of claim 11, wherein an amount of water W ($g/M^2$) supplied on the surface of the printing plate precursor and a coating coverage Q ($g/m^2$) of the layer A satisfy the following formula, $$0.1 \leq W/Q \leq 50.$$

13. The method of claim 1, wherein the step (a) is carried out after the printing plate precursor is mounted on a plate cylinder of a printing press.

14. The method of claim 1, wherein an infrared laser is employed for imagewise exposing the printing plate precursor.

* * * * *